United States Patent
Keller et al.

(10) Patent No.: US 7,386,826 B1
(45) Date of Patent: Jun. 10, 2008

(54) USING REDUNDANT ROUTING TO REDUCE SUSCEPTIBILITY TO SINGLE EVENT UPSETS IN PLD DESIGNS

(75) Inventors: Eric R. Keller, Boulder, CO (US); Prasanna Sundararajan, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 949 days.

(21) Appl. No.: 10/603,734

(22) Filed: Jun. 24, 2003

(51) Int. Cl.
*G06F 17/50* (2006.01)

(52) U.S. Cl. .................. 716/16; 716/1; 326/9; 326/14

(58) Field of Classification Search .................. 716/1, 716/16; 326/9, 14
See application file for complete search history.

(56) References Cited

U.S. PATENT DOCUMENTS

| | | | | |
|---|---|---|---|---|
| 5,552,721 | A | * | 9/1996 | Gould .......................... 326/39 |
| 5,552,722 | A | * | 9/1996 | Kean ............................ 326/41 |
| 5,581,198 | A | * | 12/1996 | Trimberger .................. 326/38 |
| 5,598,108 | A | * | 1/1997 | Pedersen ..................... 326/41 |
| 5,631,578 | A | * | 5/1997 | Clinton et al. ............... 326/41 |
| 5,867,507 | A | * | 2/1999 | Beebe et al. ................ 714/726 |
| 5,925,920 | A | | 7/1999 | MacArthur et al. |
| 6,049,487 | A | * | 4/2000 | Plants et al. .......... 365/189.04 |
| 6,127,864 | A | * | 10/2000 | Mavis et al. ................ 327/144 |
| 6,211,695 | B1 | * | 4/2001 | Agrawal et al. ............. 326/40 |
| 6,505,337 | B1 | | 1/2003 | Wittig et al. |
| 6,617,912 | B1 | | 9/2003 | Bauer |
| 6,621,296 | B2 | | 9/2003 | Carberry et al. |
| 6,621,298 | B2 | | 9/2003 | Agrawal et al. |
| 6,671,202 | B1 | | 12/2003 | Bauer |
| 6,798,270 | B1 | * | 9/2004 | Bauer .......................... 327/408 |
| 6,810,513 | B1 | * | 10/2004 | Vest ............................. 716/16 |
| 6,838,899 | B2 | * | 1/2005 | Plants .......................... 326/9 |
| 6,903,571 | B1 | | 6/2005 | Trimberger |
| 7,023,235 | B2 | | 4/2006 | Hoff |

(Continued)

OTHER PUBLICATIONS de Lima; "Designing single event upset mitigation techniques for large SRAM-based FPGA devices"; Thesis Proposal; Porto Alegre, Feb. 11, 2002 [online], [tetieved on Apr. 27, 2007]. Retreived from the Internet <URL:http://www.inf.ufrgs.br/~fglima/lima_proposal.pdf>.*

(Continued)

*Primary Examiner*—Jack Chiang
*Assistant Examiner*—Naum B Levin
(74) *Attorney, Agent, or Firm*—Lois D. Cartier (57) ABSTRACT

Methods of implementing designs in programmable logic devices (PLDs) to reduce susceptibility to single-event upsets (SEUs) by taking advantage of the fact that most PLD designs leave many routing resources unused. The unused routing resources can be used to provide duplicate routing paths between source and destination of signals in the design. The duplicate paths are selected such that an SEU in a routing multiplexer included in each path simply switches the signal between the two paths. Thus, if one path is disabled due to an SEU, the other path can still provide the necessary connection, and the functionality of the design is unaffected. The methods can be applied, for example, to routing software for field programmable gate arrays (FPGAs) having programmable routing multiplexers controlled by static RAM-based configuration memory cells.

27 Claims, 8 Drawing Sheets

U.S. PATENT DOCUMENTS

| | | | |
|---|---|---|---|
| 7,111,215 B1* | 9/2006 | Keller et al. | 714/725 |
| 7,200,822 B1* | 4/2007 | McElvain | 716/3 |
| 2001/0037482 A1* | 11/2001 | Plants | 714/763 |
| 2002/0095649 A1* | 7/2002 | Sample et al. | 716/12 |
| 2003/0173993 A1* | 9/2003 | Gupta | 326/41 |
| 2004/0080999 A1* | 4/2004 | Madurawe | 365/200 |

OTHER PUBLICATIONS

Phil Brinkley, Carl Carmichael; XAPP181 (v1.0); "SEU Mitigation Design Techniques for the XQR4000XL"; Mar. 15, 2000; available from Xilinx, Inc., 2100 Logic Drive, San Jose, CA 95124 or http//www.xilinx.com.; pp. 1-14.

U.S. Appl. No. 09/783,821, filed Feb. 14, 2001, Carmichael et al.

* cited by examiner

USING REDUNDANT ROUTING TO REDUCE SUSCEPTIBILITY TO SINGLE EVENT UPSETS IN PLD DESIGNS

FIELD OF THE INVENTION

The invention relates to programmable logic devices (PLDs) subject to single event upsets (SEUs). More particularly, the invention relates to methods of using redundant routing resources to minimize the susceptibility to SEUs of a design implemented in a PLD.

BACKGROUND OF THE INVENTION

Programmable logic devices (PLDs) are a well-known type of digital integrated circuit that can be programmed to perform specified logic functions. For example, one type of PLD, the field programmable gate array (FPGA), typically includes an array of configurable logic blocks (CLBs) surrounded by a ring of programmable input/output blocks (IOBs). Some FPGAs also include additional logic blocks with special purposes (e.g., DLLs, RAMs, processors, and so forth).

FPGA logic blocks typically include programmable logic elements such as lookup tables (LUTs), memory elements, multiplexers, and so forth. The LUTs are typically implemented as RAM arrays in which values are stored during "configuration" (i.e., programming) of the FPGA. The flip-flops, multiplexers, and other components are also programmed by writing configuration data to configuration memory cells included in the logic block. For example, the configuration data bits can enable or disable elements, alter the aspect ratios of memory arrays, select latch or flip-flop functionality for a memory element, and so forth. The configuration data bits can also interconnect the logic elements in various ways within a logic block by programming select values for multiplexers inserted in the interconnect paths within the logic block.

The various logic blocks are interconnected by a programmable interconnect structure that includes a large number of programmable interconnect lines (e.g., metal traces). The interconnect lines and logic blocks are interconnected using programmable interconnect points (PIPs). For example, a PIP can be implemented as a simple CMOS passgate. When the passgate is turned on, the two interconnect lines on either side of the passgate are electrically connected. When the passgate is turned off, the two interconnect lines are isolated from each other. Thus, by controlling the values on the gate terminals of the passgates, circuit connections can be easily made and altered. The value controlling each passgate is also stored in a configuration memory cell.

Figure 1:
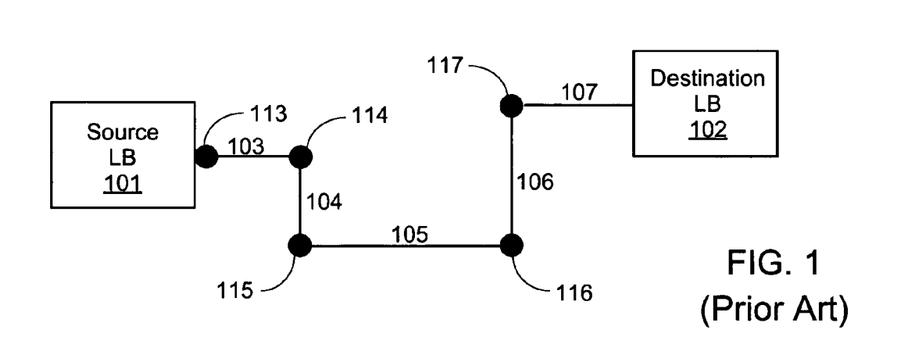
FIG. 1 shows an exemplary routing path between a source logic block and a destination logic block in a PLD generated using known methods.

FIG. 1 shows an exemplary implementation of a routing path between a source logic block (LB) 101 and a destination logic block 102. In the PLD of FIG. 1, each interconnect line (103-107) is driven by an associated programmable routing multiplexer (113-117, respectively). In some PLDs, interconnect line 103 is driven by a driver or multiplexer included in source logic block 101, i.e., multiplexer 113 is omitted. The path between the source 101 and destination 102 logic blocks traverses multiplexer 113, interconnect line 103, multiplexer 114, interconnect line 104, multiplexer 115, interconnect line 105, multiplexer 116, interconnect line 106, multiplexer 117, and interconnect line 107.

Figure 2:
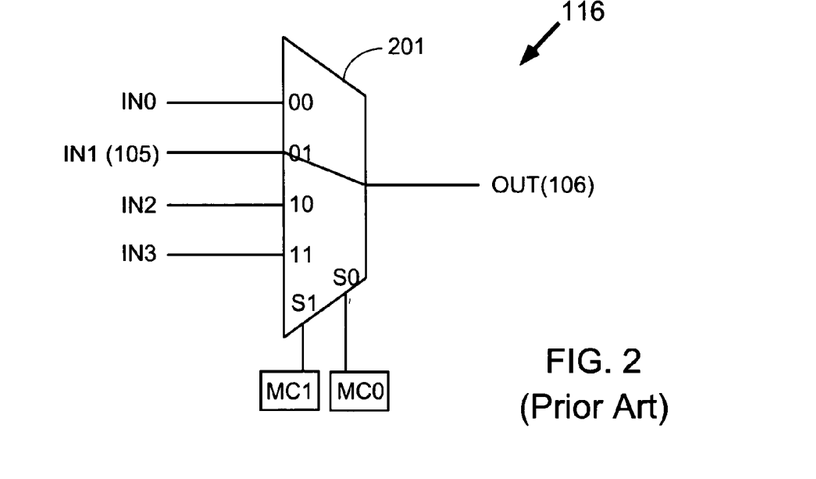
FIG. 2 shows a 4-input routing multiplexer that can be used, for example, in the routing path of FIG. 1.

FIG. 2 shows one possible implementation of routing multiplexer 116 of FIG. 1, in which routing multiplexer 116 includes a 4-input multiplexer 201 controlled by two configuration memory cells MC1 and MC0. The values stored in configuration memory cells MC1 and MC0 select one of the input signals IN0-IN3 to be passed to the output node OUT. (In the present specification, the same reference characters are used to refer to terminals, interconnect lines, nodes, and their corresponding signals.) In the pictured example, input terminal IN1 of multiplexer 201 is coupled to interconnect line 105 of FIG. 1. The other input terminals IN0, IN2, IN3 are coupled to other interconnect lines (not shown). Configuration memory cells MC1 and MC0 store low and high values, respectively, selecting the signal on interconnect line 105 to be passed to the output node OUT through input terminal IN1. The output node OUT is coupled to interconnect line 106 of FIG. 1.

Routing multiplexers typically include more than four input signals, but four input signals are shown in FIG. 2, for clarity. The number of configuration memory cells controlling the multiplexer depends at least in part on the number of input signals to the multiplexer.

In FPGAs, configuration memory cells are typically implemented as static RAM (random access memory) cells. Each FPGA typically contains many thousands or even millions of these static RAM configuration memory cells.

When bombarded by high-energy particles, a static RAM cell can change state. For example, a stored high value can be inadvertently changed to a low value, and vice versa. These inadvertent and undesired state changes are known as "single event upsets", or SEUs. Sometimes an SEU has no effect on the functionality of the design. At other times, an SEU can change the function of an FPGA such that the circuit implemented in the FPGA no longer functions properly.

For example, if a static RAM cell controlling a passgate changes state, but the two interconnect lines on either side of the passgate are not used in the design, this change of state has no effect on the function of the circuit. Similarly, a change of state in a memory cell in an unused LUT has no effect. However, when SEUs occur in portions of the FPGA that are in use, the SEUs can result in loss of function for the design implemented in the FPGA.

In some applications, such as space-based applications in a low-earth orbit, it is important to minimize the effects of SEUs in PLD-based (e.g., FPGA-based) designs. SEUs can also be a concern in some earth-based systems, e.g., systems in high altitude locations. One method of mitigating and minimizing these effects is "triple modular redundancy", or TMR, in which three copies of a circuit are included in a design. Any two copies of the circuit can override output from the third copy, if it generates data different from the other copies. While useful in many applications, implementing a circuit using TMR requires about three times as many programmable resources as a standard implementation.

Therefore, it is desirable to provide methods other than TMR that will reduce the susceptibility to SEUs of a PLD design.

SUMMARY OF THE INVENTION

The invention provides methods of implementing designs in programmable logic devices (PLDs) to reduce susceptibility to single-event upsets (SEUs). The methods of the invention take advantage of the fact that most PLD designs leave many routing resources unused. The unused routing resources can be used to provide duplicate paths between source and destination of signal paths in the design. The duplicate paths are selected such that an SEU in a routing multiplexer included in each path simply switches the signal between the two paths. Thus, if one path is disabled due to an SEU, the other path can still provide the necessary connection, and the functionality of the design is unaffected. The methods of the invention can be applied, for example, to routing software for field programmable gate arrays (FPGAs) having programmable routing multiplexers controlled by static RAM-based configuration memory cells.

In some embodiments, the duplicate paths are provided during the routing phase of the place-and-route implementation of the PLD design. In other embodiments, a post-processing step performed on a previously placed and routed PLD design adds additional paths to reduce the susceptibility of the design to SEUs.

BRIEF DESCRIPTION OF THE DRAWINGS

The present invention is illustrated by way of example, and not by way of limitation, in the following figures.

DETAILED DESCRIPTION OF THE DRAWINGS

The present invention is believed to be applicable to a variety of programmable logic devices (PLDs). The methods of the invention have been found to be particularly applicable and beneficial for designs implemented using field programmable gate arrays (FPGAs) controlled by static RAM-based configuration memory cells. However, the methods of the invention are not so limited, and can be applied to any PLD subject to single event upsets.

The implementation of a design in a PLD typically includes two phases. In the "placement" phase, the design is divided into sub-circuits, where each sub-circuit is sized to fit into one of the available programmable logic blocks (or into a portion of one of the available blocks). This step is known as "mapping". Each sub-circuit is then assigned to one of the programmable logic blocks in the PLD. The result of this process is a PLD placement that includes the logic in the design but does not include the interconnections between logic in different logic blocks. In the "routing" phase, the nodes (nets) interconnecting the various logic blocks are added to the design. Once the design has been fully implemented, e.g., placed and routed in the PLD, a configuration data file is generated from the placed and routed design. The configuration data file will implement the design when loaded into the PLD.

According to one aspect of the present invention, the routing software for the PLD can be designed to implement more than one routing path for one or more of the nodes in the design. The duplicate paths are selected such that an SEU in a routing multiplexer included in each path simply switches the signal between the two paths. Thus, if one path is disabled due to an SEU, the other path can still provide the necessary connection, and the functionality of the design is unaffected.

According to another aspect of the invention, a post-processing step can be added after the routing phase of the PLD implementation process. Thus, standard placement and routing software can be used to generate a placed and routed design, and the post-processing software can add additional routing paths selected such that an SEU in a routing multiplexer on the path simply switches the signal between the two paths.

Figure 3:
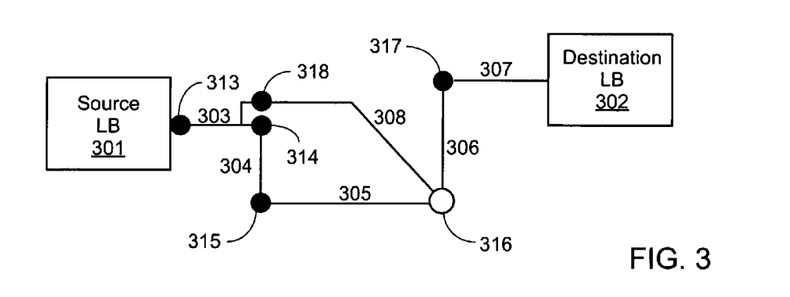
FIG. 3 shows exemplary routing paths implemented in a PLD according to an embodiment of the present invention.

FIG. 3 shows an exemplary implementation of two routing paths between a source logic block (LB) 301 and a destination logic block 302, implemented according to one embodiment of the invention. In the PLD of FIG. 3, each interconnect line (303-307) is driven by an associated programmable routing multiplexer (313-317, respectively). In some PLDs, interconnect line 303 is driven by a driver or multiplexer included in source logic block 301, i.e., multiplexer 313 is omitted.

A first routing path between the source 301 and destination 302 logic blocks traverses multiplexer 313, interconnect line 303, multiplexer 314, interconnect line 304, multiplexer 315, interconnect line 305, multiplexer 316, interconnect line 306, multiplexer 317, and interconnect line 307. A second routing path between the source 301 and destination 302 logic blocks traverses multiplexer 313, interconnect line 303, multiplexer 318, interconnect line 308, multiplexer 316, interconnect line 306, multiplexer 317, and interconnect line 307.

The two routing paths between the source and destination logic blocks are not randomly selected, nor are they selected simply to minimize the distance traveled or the delay on the node. Instead, the routing paths are selected in a fashion designed to reduce the susceptibility of the design to SEUs. However, given this constraint, due consideration can also be given to other factors such as distance and delay, if desired. For example, in an FPGA there are often many different equivalent routes, i.e., interconnect lines having the same length and the same delay. For example, routing software can be programmed to preferentially use similar types of interconnect lines when implementing redundant routing, such that predefined timing constraints are still met. As another option, the software can be designed to omit redundant routing whenever the addition of the redundant routing prevents meeting the imposed timing constraints.

Figure 4:
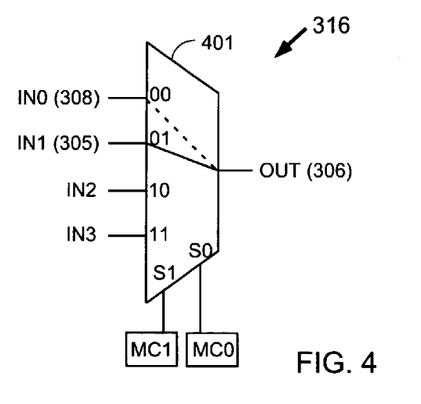
FIG. 4 shows one implementation of a 4-input multiplexer that can be used, for example, in the routing paths of FIG. 3.

FIG. 4 illustrates an exemplary way in which a design can be made less susceptible to SEUs. FIG. 4 shows one possible implementation of multiplexer 316 of FIG. 3, in which routing multiplexer 316 includes a 4-input multiplexer 401 controlled by two configuration memory cells MC1 and MC0. The values stored in configuration memory cells MC1 and MC0 select one of the input signals IN0-IN3 to drive the output node OUT, which is coupled in this example to interconnect line 306 of FIG. 3. In the pictured example, input terminal IN1 of multiplexer 401 is coupled to interconnect line 305, and input terminal IN0 is coupled to interconnect line 308. Configuration memory cells MC1 and MC0 store low and high values, respectively, selecting interconnect line 305 to drive output signal OUT.

Note that if an SEU were to affect memory cell MC0, the values stored in memory cells MC1 and MC0 would both be low. In that event, multiplexer 401 would select interconnect line 308 from input terminal IN0 to drive interconnect line 306. However, the same signal (from interconnect line 303) is supplied to each of interconnect lines 305 and 308. Thus, this SEU would not cause any change to the logical functionality of the circuit, although the signal delay might or might not change.

Routing multiplexers typically include more than four input signals, but four input signals are shown in FIG. 4, for clarity. The number of configuration memory cells in the routing multiplexer depends at least in part on the number of input signals to the multiplexer.

The multiplexer configuration shown in FIG. 4 is immune to the effects of an SEU occurring in memory cell MC0. However, an SEU occurring in memory cell MC1 would cause the IN3 input terminal of multiplexer 401 to be selected (the values stored in memory cells MC1 and MC0 would both be high). Therefore, the multiplexer configuration shown in FIG. 4, while less susceptible than multiplexer 116 of FIG. 2, is still susceptible to SEUs.

Figure 5:
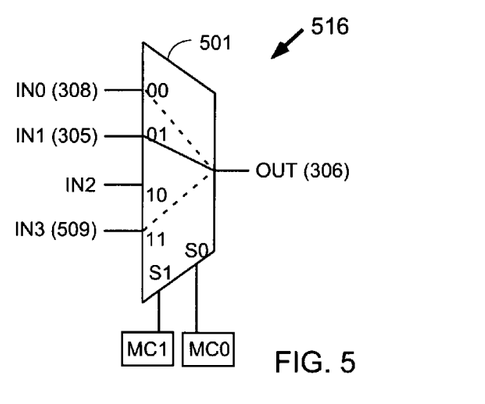
FIG. 5 shows one implementation of a 4-input multiplexer that can be used, for example, in the routing paths of FIG. 6.

FIG. 5 addresses this issue by providing a multiplexer configuration immune to SEUs in either memory cell. In the multiplexer configuration of FIG. 5, routing multiplexer 516 includes a 4-input multiplexer 501 controlled by two configuration memory cells MC1 and MC0. The values stored in configuration memory cells MC1 and MC0 select one of the input signals IN0-IN3 to drive the output node OUT, which is coupled in this example to interconnect line 306 (see FIG. 6). In the pictured example, input terminal IN1 of multiplexer 501 is coupled to interconnect line 305, input terminal IN0 is coupled to interconnect line 308, and input terminal IN3 is coupled to interconnect line 509 (see FIG. 6). Configuration memory cells MC1 and MC0 store low and high values, respectively, selecting interconnect line 305 to drive output signal OUT.

Figure 6:
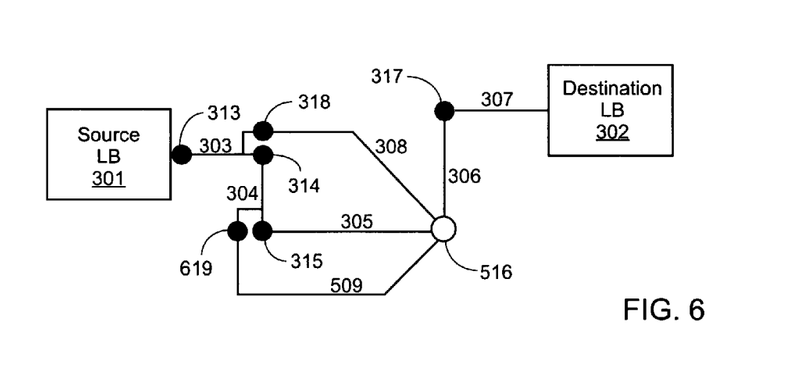
FIG. 6 shows exemplary routing paths implemented in a PLD according to another embodiment of the present invention.

FIG. 6 shows exemplary routing paths in which the multiplexer configuration of FIG. 5 can be applied with the desired result. The routing paths shown in FIG. 6 are similar to those shown in FIG. 3, but with the addition of routing multiplexer 619 and interconnect line 509. Routing multiplexer 516 can be implemented, for example, as shown in FIG. 5.

Returning to FIG. 5, as in the multiplexer configuration shown in FIG. 4, if an SEU were to affect memory cell MC0, the values stored in memory cells MC1 and MC0 would both be low. In that event, multiplexer 501 would be selecting interconnect line 308 to drive interconnect line 306. However, the same signal (from interconnect line 303) is supplied to each of interconnect lines 305 and 308. Thus, this SEU would not affect the logical functionality of the circuit, although the signal delay might or might not change.

Unlike the multiplexer configuration shown in FIG. 4, an SEU affecting memory cell MC1 is also addressed in FIGS. 5 and 6. If an SEU were to affect memory cell MC1, the values stored in memory cells MC1 and MC0 would both be high. In that event, multiplexer 501 would select interconnect line 509 to drive interconnect line 306. Therefore, if the same signal is supplied to each of interconnect lines 305, 308, and 509, this SEU also would not affect the logical functionality of the circuit.

Many other implementations are also possible for routing multiplexer 516. For example, when routing multiplexer 516 is a 4-input multiplexer controlled by two memory cells as shown in FIG. 5, the possible choices for the input terminals to be coupled together are as shown in Table 1. The first column in Table 1 shows the values initially selected for memory cells MC1, MC0. The second column shows which input terminal is selected by the initial values. The third column shows the input terminal that would be selected in the event of an SEU affecting memory cell MC1. The fourth column shows the input terminal that would be selected in the event of an SEU affecting memory cell MC0.

TABLE 1

| MC1, MC0 | Selected InX | SEU in MC1 | SEU in MC0 |
|---|---|---|---|
| 0, 0 | IN0 | IN2 | IN1 |
| 0, 1 | IN1 | IN3 | IN0 |
| 1, 0 | IN2 | IN0 | IN3 |
| 1, 1 | IN3 | IN1 | IN2 |

As can be seen from Table 1, when input terminal IN0 is initially selected, the effects of SEUs in the two memory cells can be cut in half by providing the IN0 input signal to either of input terminals IN2 and IN1, or removed altogether by providing the IN0 input signal to both IN2 and IN1. Similarly, when input terminal IN1 is initially selected, the effects of SEUs in the two memory cells can be cut in half by providing the IN1 input signal to either of input terminals IN3 and IN0, or removed altogether by providing the IN1 input signal to both IN3 and IN0. When input terminal IN2 is initially selected, the effects of SEUs in the two memory cells can be cut in half by providing the IN2 input signal to either of input terminals IN0 and IN3, or removed altogether by providing the IN2 input signal to both IN0 and IN3. When input terminal IN3 is initially selected, the effects of SEUs in the two memory cells can be cut in half by providing the IN3 input signal to either of input terminals IN1 and IN2, or removed altogether by providing the IN3 input signal to both IN1 and IN2.

The methods of the invention can also be applied to routing multiplexers having fewer than four input terminals, or more than four input terminals. For example, when the routing multiplexer is a 2-input multiplexer controlled by a single memory cell, routing a node to both input terminals of the multiplexer protects against SEUs regardless of which input terminal is initially selected.

Table 2 shows the possible choices for the input terminals when an exemplary 8-input routing multiplexer controlled by 3 memory cells is used. The first column in Table 2 shows the values initially selected for memory cells MC2, MC1, MC0. The second column shows which input terminal is selected by the initial values. The third column shows the input terminal that would be selected in the event of an SEU affecting memory cell MC2. The fourth column shows the input terminal that would be selected in the event of an SEU affecting memory cell MC1. The fifth column shows the input terminal that would be selected in the event of an SEU affecting memory cell MC0.

TABLE 2

| MC2, MC1, MC0 | Selected InX | SEU in MC2 | SEU in MC1 | SEU in MC0 |
|---|---|---|---|---|
| 0, 0, 0 | IN0 | IN4 | IN2 | IN1 |
| 0, 0, 1 | IN1 | IN5 | IN3 | IN0 |
| 0, 1, 0 | IN2 | IN6 | IN0 | IN3 |
| 0, 1, 1 | IN3 | IN7 | IN1 | IN2 |
| 1, 0, 0 | IN4 | IN0 | IN6 | IN5 |
| 1, 0, 1 | IN5 | IN1 | IN7 | IN4 |
| 1, 1, 0 | IN6 | IN2 | IN4 | IN7 |
| 1, 1, 1 | IN7 | IN3 | IN5 | IN6 |

Tables 1 and 2 can easily be adapted by those of skill in the art to provide tables for multiplexers having different numbers of input terminals, and for multiplexers using different decoding schemes. The methods of the invention can be applied to any multiplexer where two input terminals can be identified such that a selection is made between the two data input terminals based on the status of a single memory cell. Based on the disclosure herein, it would be clear to those of skill in the art how to make such an identification, and how to route a node to each of the data input terminals of the multiplexer. Therefore, the invention is not limited by the exemplary multiplexers described herein.

Figure 7:
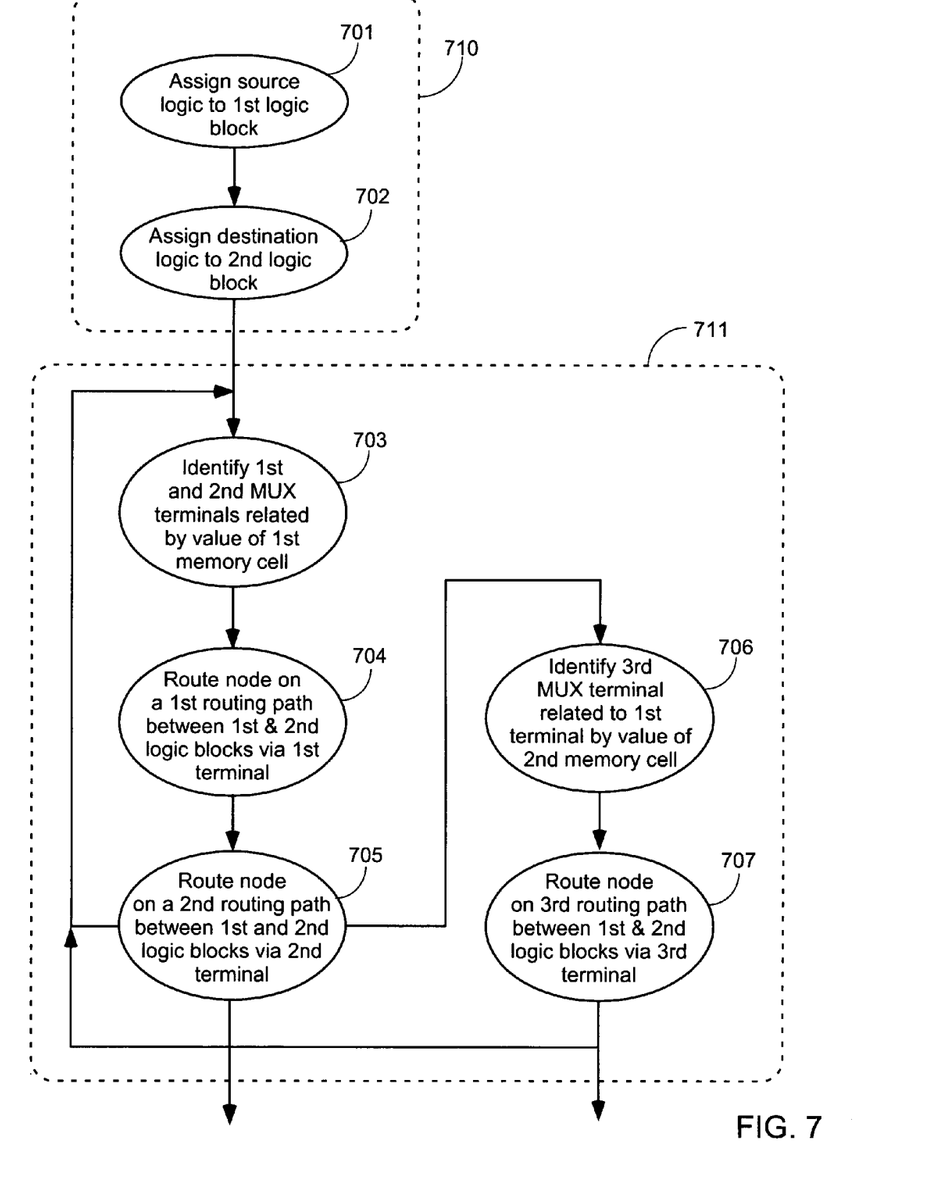
FIG. 7 shows the steps of a first method of implementing a design in a PLD to reduce susceptibility to SEUs, according to an embodiment of the invention.

FIG. 7 shows the steps of a first method of implementing a design in a PLD to reduce susceptibility to SEUs. This method can be enabled, for example, by altering existing PLD routing software to add the required new capabilities. The design includes source logic, destination logic, and a node coupled between the source logic and the destination logic.

In step 701, the source logic is assigned to a first logic block in the PLD, and in step 702, the destination logic is assigned to a second logic block in the PLD. Steps 701 and 702 can be performed, for example, by a single placement module 710. Placement module 710 can be, for example, similar to placement software now in common use for the placement of PLD designs. Steps 701 and 702 can be performed sequentially (in any order) or concurrently. In some embodiments, steps 701 and 702 are performed in an interactive fashion, i.e., with the placements of the two blocks being optimized one with the other. Such placement processes are well known to those of skill in the art.

In step 703, two related data input terminals are identified for a programmable routing multiplexer in the PLD. The two data input terminals are related in such a fashion that a selection between the two data input terminals is determined by a value stored in a memory cell controlling the programmable routing multiplexer. Therefore, if the first input terminal is selected, and the value stored in the memory cell is changed by an SEU, the second input terminal is then selected. Similarly, if the second input terminal is selected, and the value stored in the memory cell is changed by an SEU, the first input terminal is then selected.

In step 704, the node from the design is routed between the first and second logic blocks (i.e., between the source logic and the destination logic). The resulting routing path traverses the programmable routing multiplexer via the first data input terminal. In step 705, the node is again routed on a second routing path between the first and second logic blocks. The second routing path traverses the programmable routing multiplexer via the second data input terminal. The first and second routing paths can share some interconnect lines in the path, as shown in FIGS. 3 and 6, or can be independent of one another.

Steps 704 and 705 can be performed sequentially (in any order) or concurrently. In some embodiments, steps 704 and 705 are performed concurrently and in an interactive fashion, i.e., with the two routing paths being optimized one with the other. Such routing processes are well known to those of skill in the art.

In optional steps 706 and 707, a third data input terminal of the routing multiplexer is identified that is also related to the first data input terminal (step 706). The third input terminal is related to the first input terminal in such a fashion that a selection between the two data input terminals is determined by a value stored in a second memory cell controlling the programmable routing multiplexer. The node is then routed a third time, this time traversing the programmable routing multiplexer via the third data input terminal (step 707).

Steps 703-705 or 703-707 can be performed, for example, by a single routing module 711. The illustrated routing module 711 can be readily adapted from current routing software to perform the illustrative steps shown in FIG. 7.

In some embodiments, the PLD is a field programmable gate array (FPGA), and in some of these embodiments the memory cells are static RAM-based configuration memory cells of the FPGA. However, the methods of the invention (e.g., the methods illustrated in FIGS. 7-9) can be applied to any PLD that includes memory cells subject to single event upsets resulting from any cause.

Figure 8:
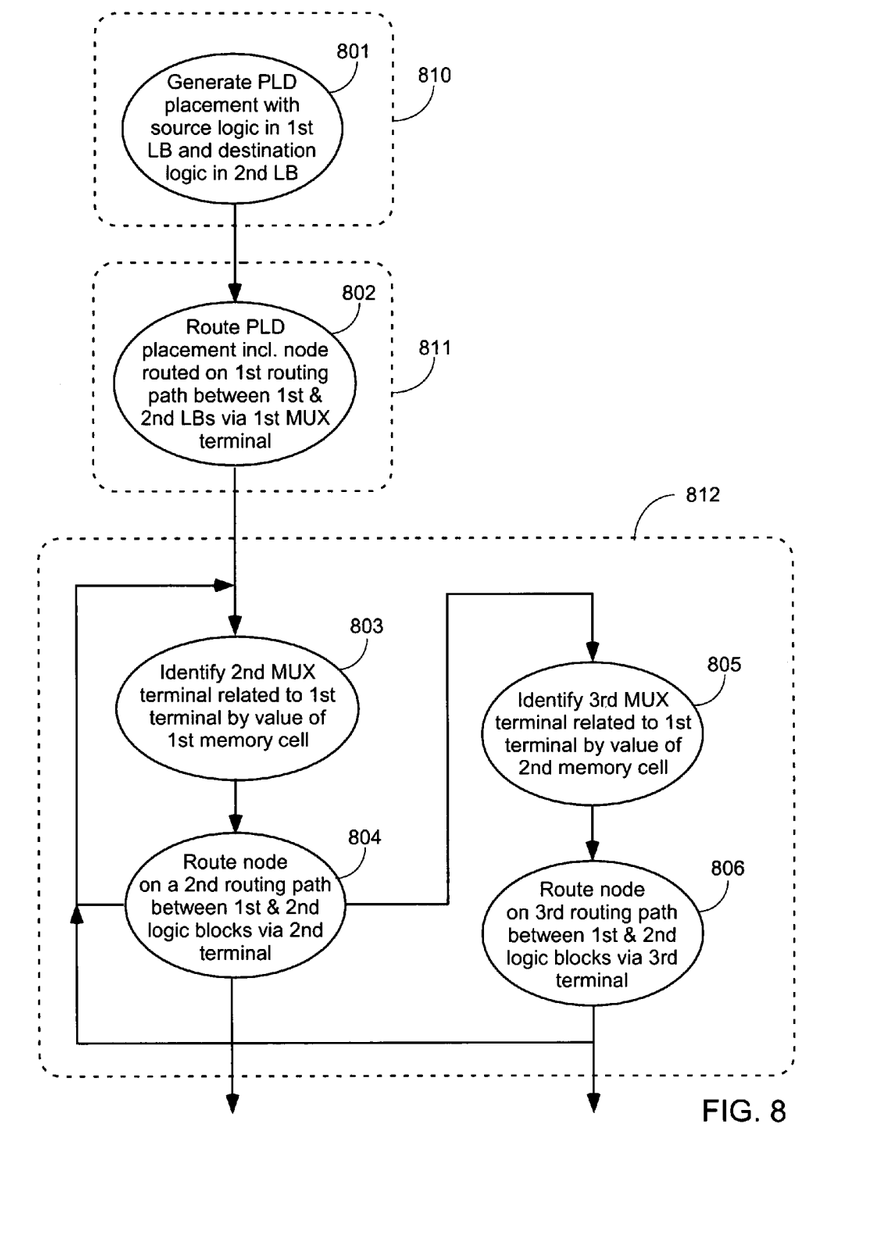
FIG. 8 shows the steps of a second method of implementing a design in a PLD to reduce susceptibility to SEUs, according to another embodiment of the invention.

FIG. 8 shows the steps of a second method of implementing a design in a PLD to reduce susceptibility to SEUs. This method can be enabled, for example, by providing a post-processing module in addition to existing PLD software. The post-processing module modifies a previously placed and routed design to add the additional path or paths of the invention. The design includes source logic, destination logic, and a node coupled between the source logic and the destination logic.

In step 801, a PLD placement of the design is generated, with the source logic assigned to a first logic block and the destination logic assigned to a second logic block. This step can be performed by a placement module 810. Placement module 810 can be, for example, placement software such as is already well known and readily available.

In step 802, the PLD placement is routed to generate a routed design. In the routed design, the PLD node is routed on a first routing path that traverses a programmable routing multiplexer via a first data input terminal. Step 802 can be performed by a routing module 811. Routing module 811 can be, for example, routing software such as is already well known and readily available.

In step 803, a second data input terminal of the routing multiplexer is identified that is related to the first data input terminal. The two data input terminals are related in such a fashion that a selection between the two data input terminals is determined by a value stored in a memory cell controlling the programmable routing multiplexer. Therefore, if the first input terminal is selected, and the value stored in the memory cell is changed by an SEU, the second input terminal is then selected. Similarly, if the second input terminal is selected, and the value stored in the memory cell is changed by an SEU, the first input terminal is then selected.

In step 804, the PLD node is routed on a second routing path between the first and second logic blocks. The second routing path traverses the programmable routing multiplexer via the second data input terminal.

Note that in some embodiments, and depending on the number and type of PLD interconnect resources left unused by the design, it might not be possible to route many (or any) of the nodes using a second routing path. In some embodiments, the routing software performing step 804 is enabled to alter the routing previously implemented in step 802 to permit the addition of a second routing path. In some embodiments, if the routing software is unable to add a second path, the software simply moves on and makes the attempt on another node. In some embodiments, the software generates a report of nodes to which a second path could not be added, or a report of nodes to which a second path was successfully added.

In optional steps 805 and 806, a third data input terminal of the routing multiplexer is identified that is also related to the first data input terminal (step 805). The third input terminal is related to the first input terminal in such a fashion that a selection between the two data input terminals is determined by a value stored in a second memory cell controlling the programmable routing multiplexer. The node is then routed a third time, this time traversing the programmable routing multiplexer via the third data input terminal (step 806).

Steps 803-804 or 803-806 can be performed, for example, by a single post-processing module 812.

Figure 9:
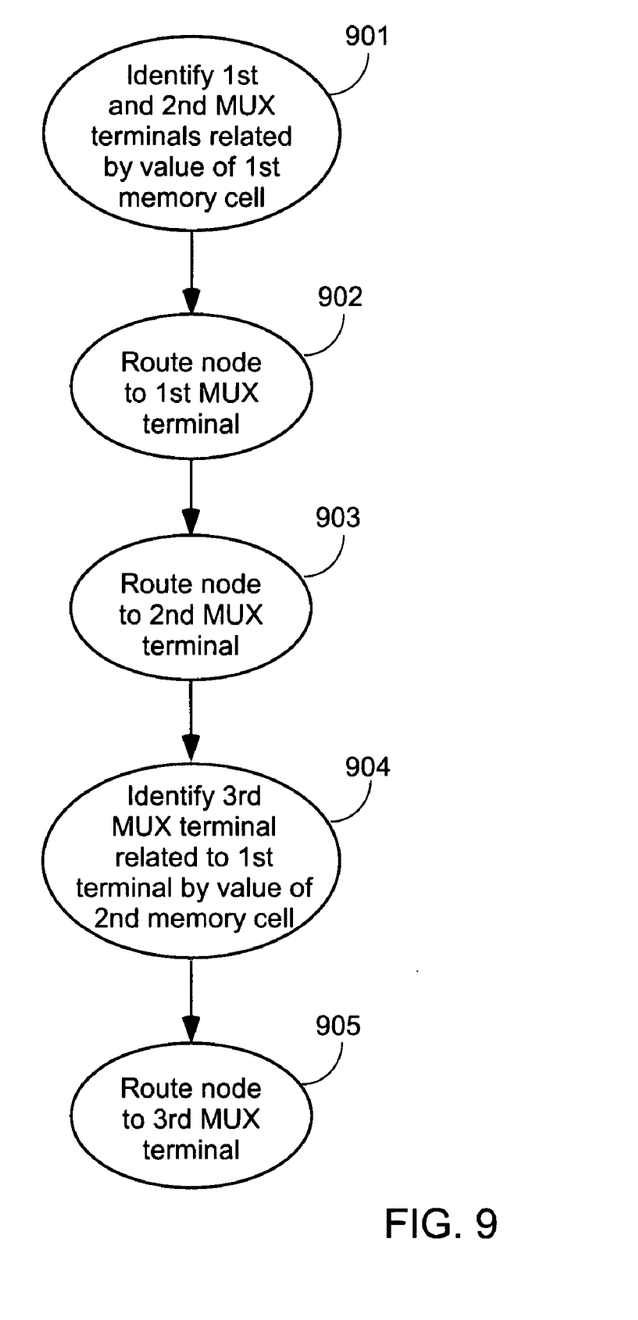
FIG. 9 shows the steps of a third method of implementing a design in a PLD to reduce susceptibility to SEUs, according to another embodiment of the invention.

FIG. 9 shows the steps of a third method of implementing a design in a PLD to reduce susceptibility to SEUs. In step 901, first and second data input terminals are identified in a programmable routing multiplexer of the PLD. The two data input terminals are related in such a fashion that a selection between the two data input terminals is determined by a value stored in a memory cell controlling the programmable routing multiplexer.

In step 902, a node in the PLD design is routed to the first data input terminal. In step 903, the node is routed to the second data input terminal. Steps 902 and 903 can be performed sequentially (in any order) or concurrently. In some embodiments, steps 902 and 903 are performed concurrently and in an interactive fashion, i.e., with the two routing paths being optimized one with the other. Such routing processes are well known to those of skill in the art.

Step 901 can be performed, for example, by an identification module. Steps 902 and 903 can be performed, for example, by a routing module. In some embodiments, the identification module is a subset of the routing module, or is under the control of the routing module.

In optional steps 904 and 905, a third data input terminal of the routing multiplexer is identified that is also related to the first data input terminal (step 904). The third input terminal is related to the first input terminal in such a fashion that a selection between the two data input terminals is determined by a value stored in a second memory cell controlling the programmable routing multiplexer. The node is then routed a third time, this time traversing the programmable routing multiplexer via the third data input terminal (step 905).

According to some embodiments of the invention, the reduced susceptibility measures described herein are applied only under certain circumstances, e.g., when the circuit being implemented is not already included in a triple modular redundancy (TMR) circuit. As previously described, one method of protecting against SEUs is to implement the circuit three times, and to allow any two of the modules to override the third module. Therefore, any module affected by an SEU is "outvoted" by the other two modules. When logic and/or circuit nodes are included in a TMR circuit, it is not usually considered necessary to apply other measures against SEUs. Therefore, for example, logic and/or nodes included in a circuit can be tested to determine if they form a portion of a TMR circuit, and the steps shown in FIGS. 7-9 (for example) can be applied only in the absence of TMR.

According to other embodiments of the invention, the reduced susceptibility measures described herein are applied only when the circuit being implemented is not already covered by other fault tolerance schemes. For example, any circuit, node, or logic can be exempted from the reduced susceptibility measures of the present invention when the circuit, node, or logic forms a portion of any logic voting scheme, e.g., three out of five. Other known methods of increasing fault tolerance can also be detected, and the methods of the invention can be applied only when these other known methods have not been previously applied.

Figure 10:
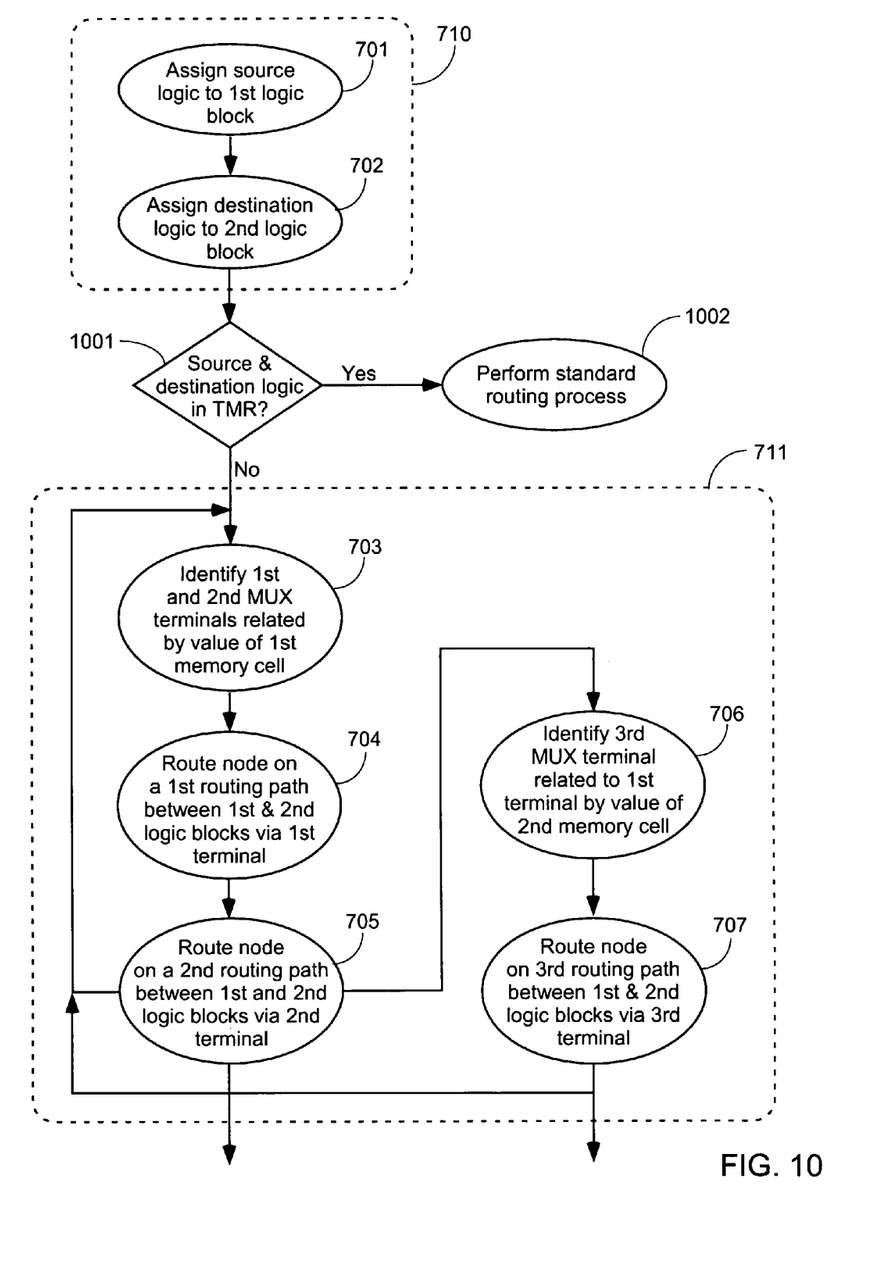
FIG. 10 shows the steps of a fourth method of implementing a design in a PLD to reduce susceptibility to SEUs, according to another embodiment of the invention.

FIG. 10 shows the steps of one such method of implementing a design in a PLD to reduce susceptibility to SEUs. Many of the steps shown in FIG. 10 are similar to steps shown in FIG. 7. However, in added step 1001 the source and destination logic assigned in steps 701 and 702 are evaluated to determine if they each form a portion of a TMR circuit. If so, standard routing processes are used to route the node between the source and destination logic (step 1002). If not, the SEU mitigating steps 703-707 are performed. Note that step 1001 can be performed prior to either or both of steps 701 and 702, if desired.

Figure 11:
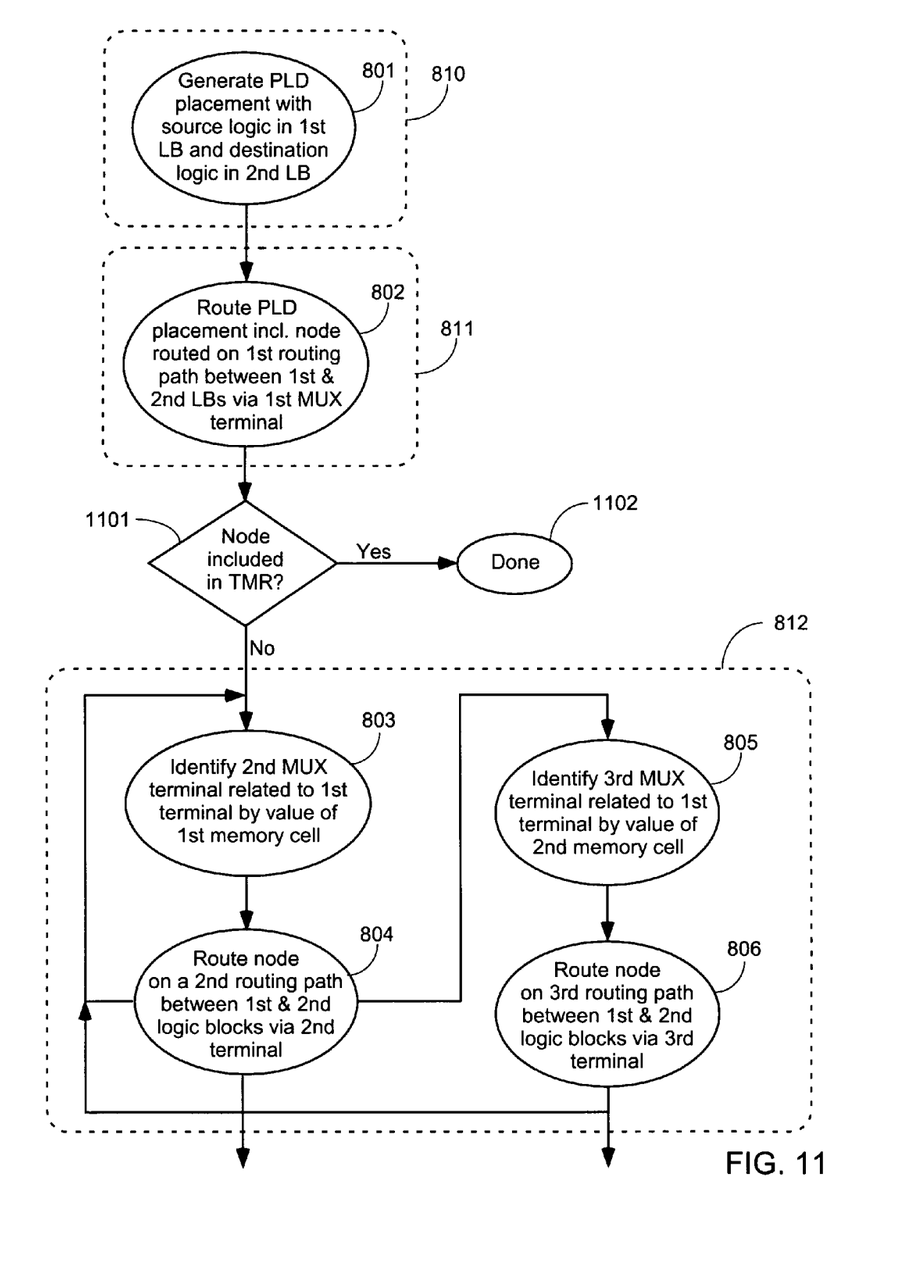
FIG. 11 shows the steps of a fifth method of implementing a design in a PLD to reduce susceptibility to SEUs, according to another embodiment of the invention.

FIG. 11 shows the steps of another such method. Many of the steps shown in FIG. 11 are similar to steps shown in FIG. 8. However, in added step 1101 the node routed in step 802 is evaluated to determine if the node is included in a TMR circuit. If so, the routing process is complete (step 1102). If not, the SEU mitigating steps 803-806 are performed. Note that step 1101 can be performed prior to either or both of steps 801 and 802, if desired.

Figure 12:
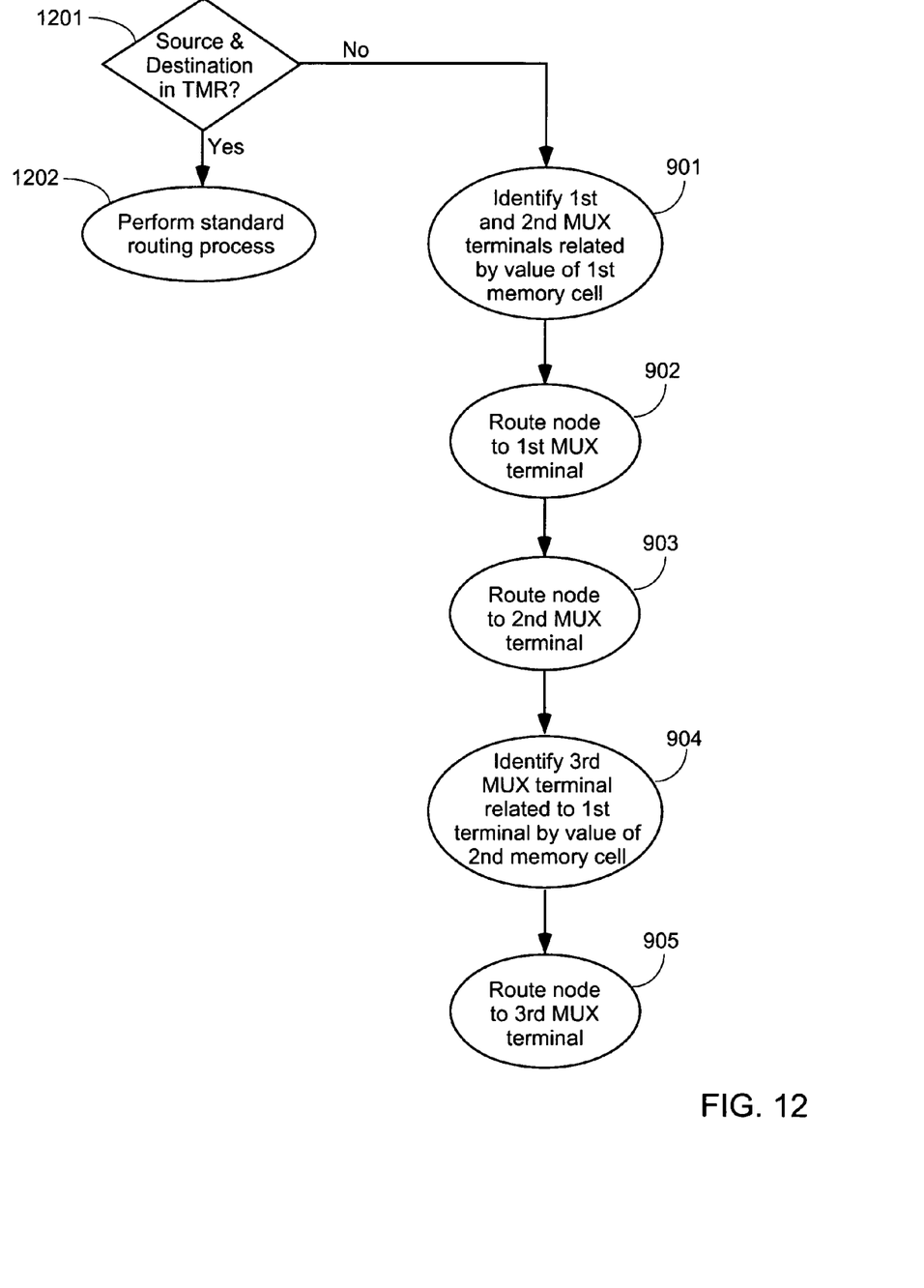
FIG. 12 shows the steps of a sixth method of implementing a design in a PLD to reduce susceptibility to SEUs, according to another embodiment of the invention.

FIG. 12 shows the steps of another such method. Many of the steps shown in FIG. 12 are similar to steps shown in FIG. 9. However, in added step 1201 a node in the PLD design is evaluated to determine if the node is included in a TMR circuit. If so, standard routing processes are used to route the node (step 1202). If not, the SEU mitigating steps 901-905 are performed.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having skill in the relevant arts of the invention will now perceive various modifications and additions that can be made as a result of the disclosure herein. Accordingly, all such modifications and additions are deemed to be within the scope of the invention, which is to be limited only by the appended claims and their equivalents.

What is claimed is:

1. A method of implementing a design in a programmable logic device (PLD) to reduce susceptibility to single-event upsets (SEUs), the design comprising source logic, destination logic, and a node coupled between the source logic and the destination logic, the method comprising:

assigning the source logic to a first logic block in the PLD;

assigning the destination logic to a second logic block in the PLD;

identifying first and second data input terminals of a programmable routing multiplexer in the PLD, wherein a selection between the first and second data input terminals is determined solely by a first value stored in a first memory cell controlling the programmable routing multiplexer;

routing the node on a first routing path between the first and second logic blocks, wherein the first routing path traverses the programmable routing multiplexer via the first data input terminal; and routing the node on a second routing path between the first and second logic blocks, wherein the second routing path traverses the programmable routing multiplexer via the second data input terminal.

2. The method of claim 1, further comprising:

identifying a third data input terminal of the programmable routing multiplexer, wherein a selection between the first and third data input terminals is determined solely by a second value stored in a second memory cell controlling the programmable routing multiplexer; and routing the node on a third routing path between the first and second logic blocks, wherein the third routing path traverses the programmable routing multiplexer via the third data input terminal.

3. The method of claim 1, wherein the PLD is a field programmable gate array (FPGA).

4. The method of claim 3, wherein the first memory cell is a static RAM-based configuration memory cell of the FPGA.

5. The method of claim 1, wherein the multiplexer is a 4-to-1 multiplexer.

6. The method of claim 1, wherein the identifying, the routing the node on the first routing path, and the routing the node on the second routing path are performed interactively with each other.

7. The method of claim 1, further comprising:

evaluating the source and destination logic and determining that the source and destination logic do not form a portion of a triple modular redundancy (TMR) circuit.

8. A computer-readable storage medium comprising computer-executable code for implementing a design in a programmable logic device (PLD) to reduce susceptibility to single-event upsets (SEUs), the design comprising source logic, destination logic, and a node coupled between the source logic and the destination logic, the medium comprising:

code for assigning the source logic to a first logic block in the PLD and assigning the destination logic to a second logic block in the PLD; and code for:

identifying first and second data input terminals of a programmable routing multiplexer in the PLD, wherein a selection between the first and second data input terminals is determined solely by a value stored in a memory cell controlling the programmable routing multiplexer, routing the node on a first routing path between the first and second logic blocks, wherein the first routing path traverses the programmable routing multiplexer via the first data input terminal, and routing the node on a second routing path between the first and second logic blocks, wherein the second routing path traverses the programmable routing multiplexer via the second data input terminal.

9. The computer-readable storage medium of claim 8, further comprising code for evaluating the source and destination logic and determining that the source and destination logic do not form a portion of a triple modular redundancy (TMR) circuit.

10. A computer system for implementing a design in a programmable logic device (PLD) to reduce susceptibility to single-event upsets (SEUs), the design comprising source logic, destination logic, and a node coupled between the source logic and the destination logic, the computer system comprising:

a placement module for assigning the source logic to a first logic block in the PLD and assigning the destination logic to a second logic block in the PLD; and a routing module for:

identifying first and second data input terminals of a programmable routing multiplexer in the PLD, wherein a selection between the first and second data input terminals is determined solely by a value stored in a memory cell controlling the programmable routing multiplexer, routing the node on a first routing path between the first and second logic blocks, wherein the first routing path traverses the programmable routing multiplexer via the first data input terminal, and routing the node on a second routing path between the first and second logic blocks, wherein the second routing path traverses the programmable routing multiplexer via the second data input terminal.

11. The computer system of claim 10, further comprising an evaluation module for evaluating the source and destination logic and determining that the source and destination logic do not form a portion of a triple modular redundancy (TMR) circuit.

12. A method of implementing a design in a programmable logic device (PLD) to reduce susceptibility to single-event upsets (SEUs), the design comprising source logic, destination logic, and a node coupled between the source logic and the destination logic, the method comprising:

generating a PLD placement wherein the source logic is assigned to a first logic block in the PLD and the destination logic is assigned to a second logic block in the PLD;

routing the PLD placement to generate a routed design wherein the node is routed on a first routing path between the first and second logic blocks, the first routing path traversing a programmable routing multiplexer via a first data input terminal of the programmable routing multiplexer;

identifying a second data input terminal of the programmable routing multiplexer, wherein a selection between the first and second data input terminals is determined solely by a first value stored in a first memory cell controlling the programmable routing multiplexer; and routing the node on a second routing path between the first and second logic blocks, wherein the second routing path traverses the programmable routing multiplexer via the second data input terminal.

13. The method of claim 12, further comprising:

identifying a third data input terminal of the programmable routing multiplexer, wherein a selection between the first and third data input terminals is determined solely by a second value stored in a second memory cell controlling the programmable routing multiplexer; and routing the node on a third routing path between the first and second logic blocks, wherein the third routing path traverses the programmable routing multiplexer via the third data input terminal.

14. The method of claim 12, wherein the PLD is a field programmable gate array (FPGA).

15. The method of claim 14, wherein the first memory cell is a static RAM-based configuration memory cell of the FPGA.

16. The method of claim 12, wherein the multiplexer is a 4-to-1 multiplexer.

17. The method of claim 12, further comprising:
evaluating the node and determining that the node is not included in a triple modular redundancy (TMR) circuit.

18. A method of implementing a design in a programmable logic device (PLD) to reduce susceptibility to single-event upsets (SEUs), the method comprising:
identifying in a programmable routing multiplexer of the PLD a first data input terminal and a second data input terminal, wherein a selection between the first and second data input terminals is determined solely by a first value stored in a first memory cell controlling the programmable routing multiplexer;
routing a node in the design to the first data input terminal; and
routing the node to the second data input terminal.

19. The method of claim 18, further comprising:
identifying in the programmable routing multiplexer a third data input terminal, wherein a selection between the first and third data input terminals is determined solely by a second value stored in a second memory cell controlling the programmable routing multiplexer; and
routing the node to the third data input terminal.

20. The method of claim 18, wherein the PLD is a field programmable gate array (FPGA).

21. The method of claim 20, wherein the first and second memory cells are static RAM-based configuration memory cell of the FPGA.

22. The method of claim 18, wherein the multiplexer is a 4-to-1 multiplexer.

23. The method of claim 18, further comprising:
evaluating the node and determining that the node is not included in a triple modular redundancy (TMR) circuit.

24. A computer-readable storage medium comprising computer-executable code for implementing a design in a programmable logic device (PLD) to reduce susceptibility to single-event upsets (SEUs), the medium comprising:
code for identifying in a programmable routing multiplexer of the PLD a first data input terminal and a second data input terminal, wherein a selection between the first and second data input terminals is determined solely by a first value stored in a first memory cell controlling the programmable routing multiplexer; and
code for routing a node in the design to both of the first and second data input terminals.

25. The computer-readable storage medium of claim 24, further comprising code for evaluating the node and determining that the node is not included in a triple modular redundancy (TMR) circuit.

26. A computer system for implementing a design in a programmable logic device (PLD) to reduce susceptibility to single-event upsets (SEUs), the computer system comprising:
an identification module for identifying in a programmable routing multiplexer of the PLD a first data input terminal and a second data input terminal, wherein a selection between the first and second data input terminals is determined solely by a first value stored in a first memory cell controlling the programmable routing multiplexer; and
a routing module for routing a node in the design to both of the first and second data input terminals.

27. The computer system of claim 26, further comprising an evaluation module for evaluating the node and determining that the node is not included in a triple modular redundancy (TMR) circuit.

* * * * *